United States Patent
Kishi et al.

(10) Patent No.: US 8,163,083 B2
(45) Date of Patent: Apr. 24, 2012

(54) SILICA GLASS CRUCIBLE AND METHOD FOR PULLING UP SILICON SINGLE CRYSTAL USING THE SAME

(75) Inventors: Hiroshi Kishi, Akita-ken (JP); Minoru Kanda, Akita-ken (JP)

(73) Assignees: Japan Super Quartz Corporation, Akita-Shi (JP); Sumco Corporation, Tokyo (JP)

( * ) Notice: Subject to any disclaimer, the term of this patent is extended or adjusted under 35 U.S.C. 154(b) by 958 days.

(21) Appl. No.: 12/169,828

(22) Filed: Jul. 9, 2008

(65) Prior Publication Data

US 2010/0006022 A1 Jan. 14, 2010

(51) Int. Cl.
| | |
|---|---|
| C30B 11/00 | (2006.01) |
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |
| C30B 19/00 | (2006.01) |
| C30B 9/00 | (2006.01) |
| C30B 17/00 | (2006.01) |
| C30B 21/02 | (2006.01) |
| C30B 28/06 | (2006.01) |

(52) U.S. Cl. .................. 117/13; 117/11; 117/60; 117/73
(58) Field of Classification Search .................. 117/13, 117/11, 60, 73
See application file for complete search history.

(56) References Cited

U.S. PATENT DOCUMENTS

| | | | |
|---|---|---|---|
| 3,837,825 A * | 9/1974 | Loxley et al. | 264/662 |
| H520 H * | 9/1988 | Johnson et al. | 117/20 |
| 5,302,556 A * | 4/1994 | Shimizu et al. | 501/12 |
| 6,187,089 B1 * | 2/2001 | Phillips et al. | 117/13 |
| 6,340,390 B1 * | 1/2002 | Asano et al. | 117/13 |
| 2004/0112274 A1 * | 6/2004 | Tsujimoto et al. | 117/2 |
| 2005/0178319 A1 | 8/2005 | Korus et al. | |

FOREIGN PATENT DOCUMENTS

| | | |
|---|---|---|
| JP | 04-202086 | 7/1992 |
| JP | 05-9097 | 1/1993 |
| JP | 10-338595 | 12/1998 |
| JP | 2000-169287 | 6/2000 |
| JP | 2001/328831 | 11/2001 |
| JP | 2001-342028 | 12/2001 |
| WO | 00/46432 | 8/2000 |

OTHER PUBLICATIONS

English Language abstract of JP 05-9097.
English Language abstract of JP 2000-169287.
Japanese Office Action dated Dec. 20, 2010.
English Language Abstract of JP 2001/328831.

* cited by examiner

*Primary Examiner* — James McDonough
(74) *Attorney, Agent, or Firm* — Greenblum & Bernstein, P.L.C.

(57) ABSTRACT

A silica glass crucible causing fewer pinholes in silicon single crystals is provided by a method of preventing pinholes by performing the pulling up of a silicon single crystal while restraining the dissolution rate of the crucible inner surface to 20 μm/hr or less, using a silica glass crucible for the pulling up of silicon single crystals, wherein the area of crystalline silica formed by crystallization of amorphous silica is restricted to 10% or less of the crucible inner surface area, or the density of pits formed from open bubbles on the crucible inner surface is restricted to 0.01 to 0.2 counts/mm$^2$.

6 Claims, 3 Drawing Sheets

SILICA GLASS CRUCIBLE AND METHOD FOR PULLING UP SILICON SINGLE CRYSTAL USING THE SAME

BACKGROUND OF THE INVENTION

1. Field of the Invention

The present invention relates to a silica glass crucible which is used for the pulling up of silicon single crystals, and produces fewer pinholes in the silicon single crystals, and a method for pulling up a silicon single crystal using the same.

2. Description of Related Art

Silicon single crystals which are used as materials for a semiconductor material such as a silicon wafer and the like, are mainly produced according to a CZ method. This production method is a method of heating and melting a polycrystalline silicon placed in a silica glass crucible to obtain a molten silicon liquid, growing a single crystal at a high temperature using a seed crystal immersed in this liquid surface, slowly pulling up the single crystal, and growing a rod-shaped single crystal therefrom.

Since the silicon single crystal is always immersed in the molten liquid at the center of the crucible during the pulling up, when air bubbles floating from the inner surface of the crucible adhere to the interface between the silicon single crystal and the molten silicon liquid, the bubbles are introduced as they are, into the silicon single crystal as pinholes. The pinholes are bubbles contained in the silicon single crystal. In the process of slicing the silicon single crystal, any wafer discovered to have pinholes is discarded, and thus pinholes provide one of the causes of decreases in product yield.

As a technology of preventing pinholes in silicon single crystals, there is known a method of melting the polycrystalline silicon raw material placed in a silica crucible at a certain range of furnace internal pressure, and performing the pulling up of a silicon single crystal at a furnace internal pressure higher than the previous pressure (Patent Document 1). Furthermore, there is also known a method of fusing the raw material within a certain range of internal furnace pressure, and then performing the pulling up of a single crystal after the fusion of raw material, at a furnace internal pressure which is lower than the internal furnace pressure at the time of fusion (Patent Document 2).

[Patent Document 1] JP-A No. 05-9097
[Patent Document 2] JP-A No. 2000-169287

The two conventional methods for preventing pinholes are both methods of preventing the air bubbles from being caught up in the silicon single crystal, by regulating the furnace internal pressure during the fusion of polycrystalline silicon and during the pulling up when performing the pulling up of a silicon single crystal. However, since the raw material polycrystalline silicon is fused in a silica glass crucible, and a silicon single crystal is pulled up from the fused silicon in the crucible, the influence of the silica glass crucible is large. However, no sufficient investigation has been made heretofore on the influence of the properties of the silica glass crucible exerted on the pinholes.

The present invention is intended to characterize the conditions for a silica glass crucible, and according to an aspect of the present invention, there is provided a silica glass crucible allowing the silicon single crystal to have fewer pinholes.

SUMMARY OF THE INVENTION

The invention relates to a silica glass crucible having the following constitution.

(1) A silica glass crucible for the pulling up of silicon single crystals, wherein pinholes of a silicon single crystal are prevented by restricting the area of crystalline silica formed by crystallization of amorphous silica, to 10% or less of the inner surface area of the crucible.

(2) A silica glass crucible for preventing pinholes of a silicon single crystal by restricting the density of pits formed from open bubbles in the crucible inner surface to 0.01 to 0.2 counts/mm$^2$.

(3) A method for pulling up a silicon single crystal, wherein pinholes are prevented by performing the pulling up of a silicon single crystal while the dissolution rate of the crucible inner surface is restricted to 20 μm/hr or less by using the silica glass crucible according to (1) or (2).

According to a first aspect of the invention, there is provided a silica glass crucible prepared by reducing the area of crystalline silica formed by crystallization of amorphous silica, to have the crystallinity of the crystalline silica be 10% or less, characterized in that the generation of pinholes is prevented upon the use of the subject crucible, by reducing the area of the crystalline silica.

Here, the crystallinity of crystalline silica is calculated by measuring the area of crystalline silica before and after the pulling up of a silicon single crystal.

If crystalline silica formed by crystallization of amorphous silica is present in the crucible inner surface, when polycrystalline silicon is melted, and the crucible is filled with a molten silicon liquid, bubbles of argon gas, which is the atmospheric gas, are likely to remain. Because of this, the bubbles are incorporated into the molten silicon liquid, causing pinholes. Thus, the silica glass crucible of the invention was treated so that the area of crystalline silica was reduced by crystal dislocation of the inner surface, and thereby it was made difficult for the bubbles to attach to the crucible inner surface. Thereby, the bubbles incorporated into the molten silicon liquid are reduced in number, and thus pinholes can be prevented.

According to a second aspect of the invention, there is provided a silica glass crucible having pits formed from open bubbles on the crucible inner surface at a certain density (0.01 to 0.2 pits/mm$^2$), wherein the presence of the pits prevents generation of pinholes upon the use of this crucible. If pits are present on the crucible inner surface at a certain density, bumping of the SiO gas generated by a reaction between silica glass and a molten silicon liquid is restricted, and the generation of large bubbles is reduced. Thus, the amount of bubbles incorporated into the silicon single crystal is reduced, and pinholes can be prevented.

According to a third aspect of the invention, there is provided a method for pulling up a silicon single crystal using the silica crucible according to the first aspect or the second aspect, wherein pinholes of a silicon single crystal can be prevented by restricting the dissolution rate of the crucible inner surface to 20 μm/hr or less.

REFERENCE NUMERALS

Figure 1:
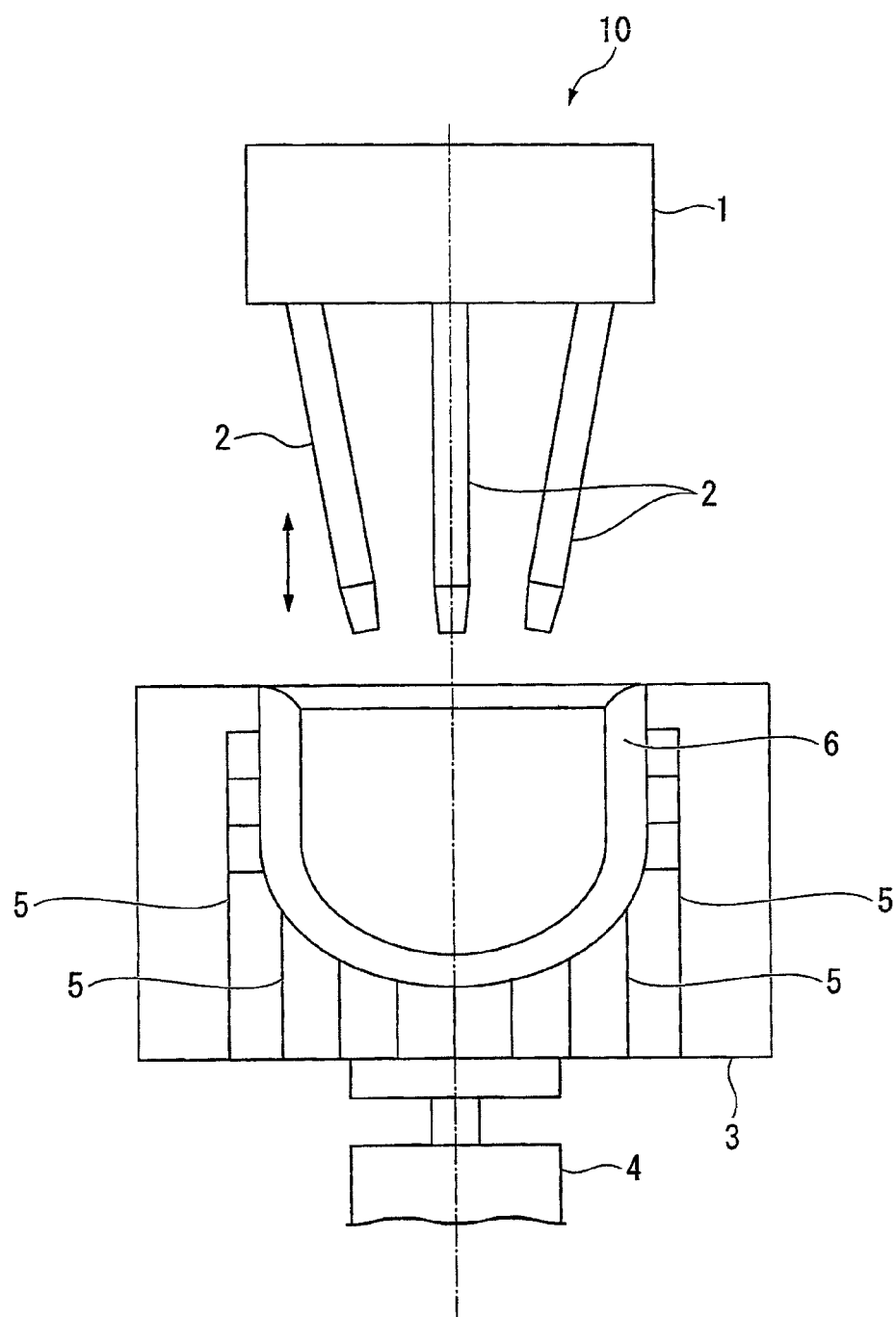
FIG. 1 is a vertical cross-sectional view showing an exemplary embodiment of the arc discharge apparatus and the apparatus for production of silica glass crucible according to the present invention.

1: Electrode drive mechanism, 2: Carbon electrode, 3: Mold, 4: Drive mechanism, 5: Depressurization channel, 6: Silica deposit layer, 10: Arc discharge apparatus, 11: Silica glass crucible, 20: Silica glass crucible, 20A: Wall part, 20B: Bight part, 20C: Bottom part, 22: Naturally occurring silica glass or silica crystal, 24: Synthetic silica glass

DETAILED DESCRIPTION OF THE INVENTION

Hereinafter, the present invention will be described in more detail with reference to exemplary embodiments.

The silica glass crucible of the first aspect of the invention is a silica glass crucible for the pulling up of silicon single crystals, wherein pinholes are prevented in a silicon single crystal by restricting the area of crystalline silica formed by crystallization of amorphous silica, to 10% or less of the inner surface of the crucible.

If crystalline silica formed by crystallization of amorphous silica is present in the crucible inner surface, when polycrystalline silicon is melted, and the crucible is charged with a molten silicon liquid, bubbles of argon gas, which is the atmospheric gas, are likely to remain on the crucible inner surface. Because of this, the bubbles are incorporated into the molten silicon liquid, causing pinholes.

The silica glass crucible of the invention was treated such that it was made difficult for bubbles to attach to the crucible inner surface, by restricting the area of crystalline silica formed by crystal dislocation of amorphous silica, to 10% or less of the total inner surface, and thereby, the bubbles incorporated into the molten silicon liquid were reduced. If the area of crystalline silica exceeds 10%, more bubbles tend to attach to the inner surface, and it is not preferable. In order to reduce the amount of crystalline silica formed by crystal dislocation of amorphous silica, it is desirable to reduce the amount of impurities which cut the structure of silica glass and accelerate rearrangement of the structure.

In addition, although colored spots (which are called brown rings) precipitating on the crucible inner surface by a reaction between silicon and silica glass of a crucible, also correspond to crystalline silica, the crystalline silica has an incomplete crystal structure ($SiO_{2-x}$), and is substantially different from the crystalline silica formed by crystal dislocation. Therefore, the area of brown rings in the invention is not included in the above-mentioned 10%.

The silica glass crucible according to the second aspect of the invention is a silica glass crucible having pinholes of a silicon single crystal prevented by restricting the density of pits formed from open bubbles on the crucible inner surface, to 0.01 to 0.2 counts/mm$^2$.

Although boiling of SiO gas may occur because of changes in the temperature and pressure during the pulling up of a silicon single crystal, if pits of an appropriate size are present at a certain density on the crucible inner surface, bumping of SiO gas generated by a reaction between silica glass and a molten silicon liquid, is suppressed. In particular, it is preferable that the pits are present on the bottom surface of the crucible at a certain density. The pits are mainly formed from open bubbles, and generally have a size of 0.2 to 2.0 mm.

The density of pits derived from open bubbles is preferably 0.01 to 0.2 counts/mm$^2$, and more preferably 0.03 to 0.15 counts/mm$^2$, even more preferably 0.05 to 0.1 counts/mm$^2$.

If the density of pits derived from open bubbles is lower than greater than 0.01 or less, 0.01 counts/mm$^2$, the effects are absent. If the density is higher than 0.2 counts/mm$^2$, the particles generated when the bubbles rupture lowers the yield of silicon single crystal.

The pits derived from open bubbles on the crucible inner surface are formed when the crucible inner surface is dissolved during the pulling up of a silicon single crystal, and the internal bubbles appear on the surface. Thus, it is desirable to control the number of the bubbles contained in the depth range of dissolution, to the above-described density. The number of bubbles can be controlled by regulating the conditions for vacuum suction during the production of crucible, or the like.

The invention includes a method for pulling up a silicon single crystal by restricting the dissolution rate of the crucible inner surface to 20 μm/hr or less using the silica glass crucible. When a silicon single crystal is pulled up while the dissolution rate of the crucible inner surface is restricted to 20 μm/hr or less using the silica glass crucible, pinholes in the silicon single crystal can be prevented.

The SiO gas is mainly generated by a reaction between a molten silicon liquid and silica glass of the crucible. Accordingly, pinholes in the silicon single crystal can be prevented by suppressing the generation of the SiO gas by restricting the dissolution rate of the crucible inner surface to the above-mentioned range. If the dissolution rate of the crucible inner surface is higher than the above-mentioned range, the effect of suppressing the generation of SiO gas is insufficient.

To obtain a crucible having a low dissolution rate of the crucible inner surface, it is important to increase the viscosity of the silica glass.

The viscosity of silica glass at this time (log η at 1550° C.) is preferably 8.6 to 9.2 P. Specifically, a crucible having crucible inner surface with a low dissolution rate can be obtained by a method of lowering the concentration of an OH group by performing the melting and heating at a higher temperature, or a method of using a raw material powder with reduced impurities. Furthermore, although the dissolution rate of the crucible inner surface may vary depending on the conditions for the pulling up of silicon single crystals, it is desirable to control the dissolution rate of the crucible inner surface to 20 μm/hr or less, by regulating the conditions for the pulling up of silicon single crystals using a crucible with a of the crucible inner surface with a low dissolution rate.

The crucible with a low dissolution rate is preferably a silica crucible having a dissolution temperature of 1450 to 1650° C., and an OH group concentration of 1 to 150 ppm.

The conditions for performing the pulling up using a silica glass crucible of such conditions and taking a dissolution rate of 20 μm/hr or less, are not limited, but as an example, a pressure of 0.40 to 66.7 kPa is preferred.

FIG. 1 shows an example of the apparatus for production of silica glass crucible, which can be used in the invention, and this apparatus mainly consists of a mold 3 which is cylindrically shaped with a bottom, a drive mechanism 4 for rotating the mold 3 by axial rotation, and an arc discharge apparatus 10 for heating the inside of the mold 3.

The mold 3 is, for example, formed from carbon, and in the inside thereof, a plurality of depressurization channels 5 are formed open to the inner side of the mold.

A depressurization mechanism, which is not depicted, is connected to the depressurization channels 5, so that the mold 3 can be rotated and at the same time, can be subjected to air suction from the inner side through the depressurization channels 5.

In the inner side of the mold 3, a silica deposit layer 6 can be formed by depositing silica powder thereon.

This silica deposit layer 6 is maintained on the inner wall surface by the centrifugal force generated by the rotation of the mold 3.

When depressurization is performed through the depressurization channels 5 while the maintained silica deposit layer 6 is heated with an arc discharge apparatus 10, the silica deposit layer 6 melts to form a silica layer.

After cooling, the silica glass crucible is removed from the mold 3 and shaped to produce a silica glass crucible.

The arc discharge apparatus 10 includes a plurality of carbon electrodes 2 in the shape of a rod formed from high purity carbon, an electrode displacement mechanism 1 for maintaining and displacing these carbon electrodes 2, and a power supply unit (not depicted) for passing an electric current to the respective carbon electrodes 2.

There are three carbon electrodes 2 in this example, but it is acceptable if arc discharge can be generated between the carbon electrodes 2, and the number of the carbon electrodes may be two, or even four or more.

The shape of the carbon electrode 2 is also not limited.

The carbon electrodes 2 are disposed such that they approach each other closer at the tip end.

The power supply may be direct current or alternating current, but in this exemplary embodiment, each phase of a three phase alternating current is connected to each of the three carbon electrodes 2.

Figure 2:
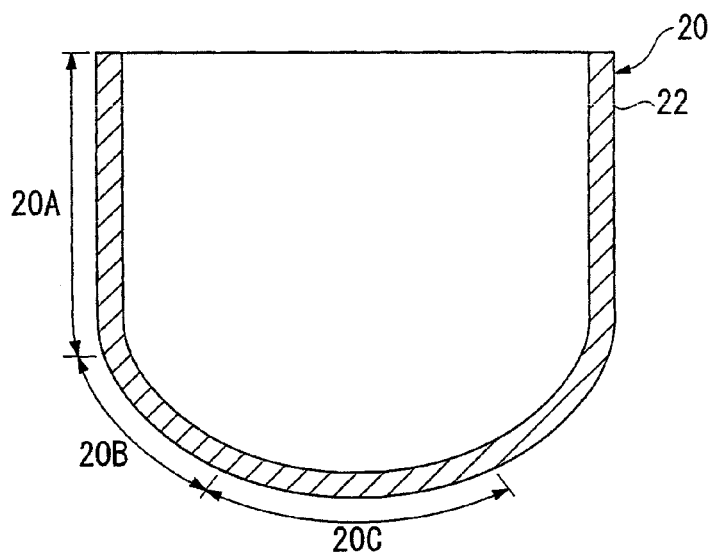
FIG. 2 is a vertical cross-sectional view showing an exemplary embodiment of the silica glass crucible according to the invention.

FIG. 2 shows an example of the silica glass crucible.

This silica glass crucible 20 consists of a wall part 20A, a bight part 20B, and a bottom part 20C, and is formed of natural silica glass 22.

The silica glass crucible of the invention can be formed into a variety of forms, as found in the exemplary embodiment shown in FIG. 2, such as a form in which the entirety (or a part) of the crucible is formed of the natural silica glass 22; a form in which at least the surface layer of the crucible is formed of the silica glass having a property for reverse crystallization without any added crystallization accelerator, or a form in which the wall part 20A, the bight part 20B, or at least the outer surface layer of the wall part 20A, of the crucible is formed of natural silica glass 22.

Figure 3:
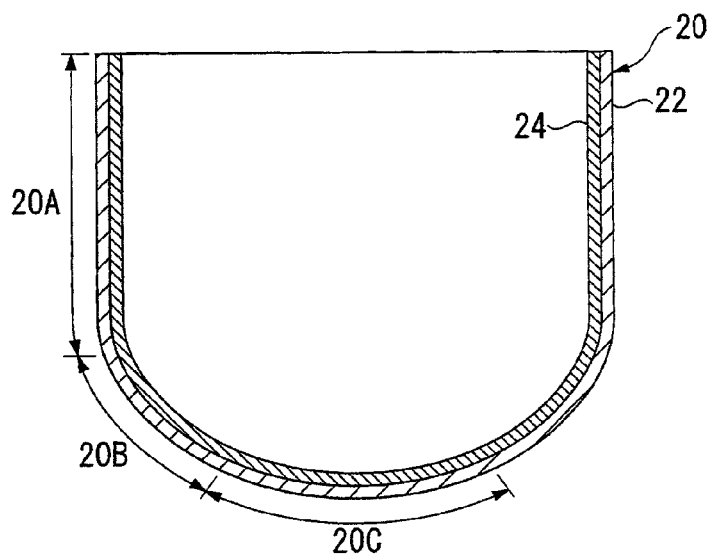
FIG. 3 is a vertical cross-sectional view showing another exemplary embodiment of the silica glass crucible according to the invention.

FIG. 3 shows another exemplary embodiment of the silica glass crucible.

This silica glass crucible 20 consists of a wall part 20A, a bight part 20B, and a bottom part 20C, and the inner surface layer is formed of synthetic silica glass 24, while the outer surface layer is formed of natural silica glass 22.

In order to produce such a silica glass crucible, the production is performed by depositing crystalline natural quartz powder on the inner surface of a rotating mold, depositing crystalline synthetic silica powder thereon (inner peripheral side), and heating the silica powders to melt at a vitrification temperature (1710° C. or higher and 1780° C. or lower, preferably 1730° C. or higher and 1750° C. or lower).

The part formed of natural silica glass 22 may not be the entire area of the outer surface layer of the crucible, but may be only the outer surface layer of the wall part 20A.

It is because the strength of the wall part 20A is particularly important.

The powder of synthetic silica has an average particle size of 350 micrometers, and a particle size range of 60 to 600 μm.

The powder of natural quartz has an average particle size of 250 micrometers, and a particle size range of 50 to 500 μm.

Those conventional silica glass crucibles have a crystalline silica layer in a semi-molten state on the outer side of the crucible of a thickness of 100 μm to 300 μm, so as to facilitate removal thereof from the mold.

Furthermore, for the silica glass member, the crystallization in the depth direction (thickness direction) is very slow compared to the crystallization of the surface, and is strongly affected by the crystalline form at the surface.

A silica glass crucible having an unstable crystalline structure at the surface would not have crystallization proceeded along the depth direction, as long as the unstable structure at the surface is not solved.

Therefore, it is preferable to form the outer surface of a crucible from the silica glass having a property of reverse crystallization, by removing the crystalline silica layer remaining on the outer surface of the silica glass crucible.

In such a silica glass crucible, crystallization proceeds rapidly from the outer surface of the crucible into the depth direction, and as a result, a thick and uniform crystal layer is obtained, and the strength of the crucible is enhanced.

When the silica glass crucible 11 of the invention is used, the crucible strength is maintained under high temperatures at the time of use, and internal collapse or subduction of the wall part of the crucible does not occur. Thus, a high single crystal yield can be obtained.

Here, the single crystal yield is the DF (dislocation free) rate of a single crystal, and corresponds to the weight of the part corresponding to the length along the pulling axis direction in the straight trunk part of a pulled-up silicon single crystal, which does not include the dislocated part on the cross-section along the diameter direction, with respect to the total weight of the polycrystalline silicone raw material charged into the silica glass crucible, expressed in a percentage.

The invention encompasses such method for producing a silicon single crystal using the silica glass crucible.

Figure 4:
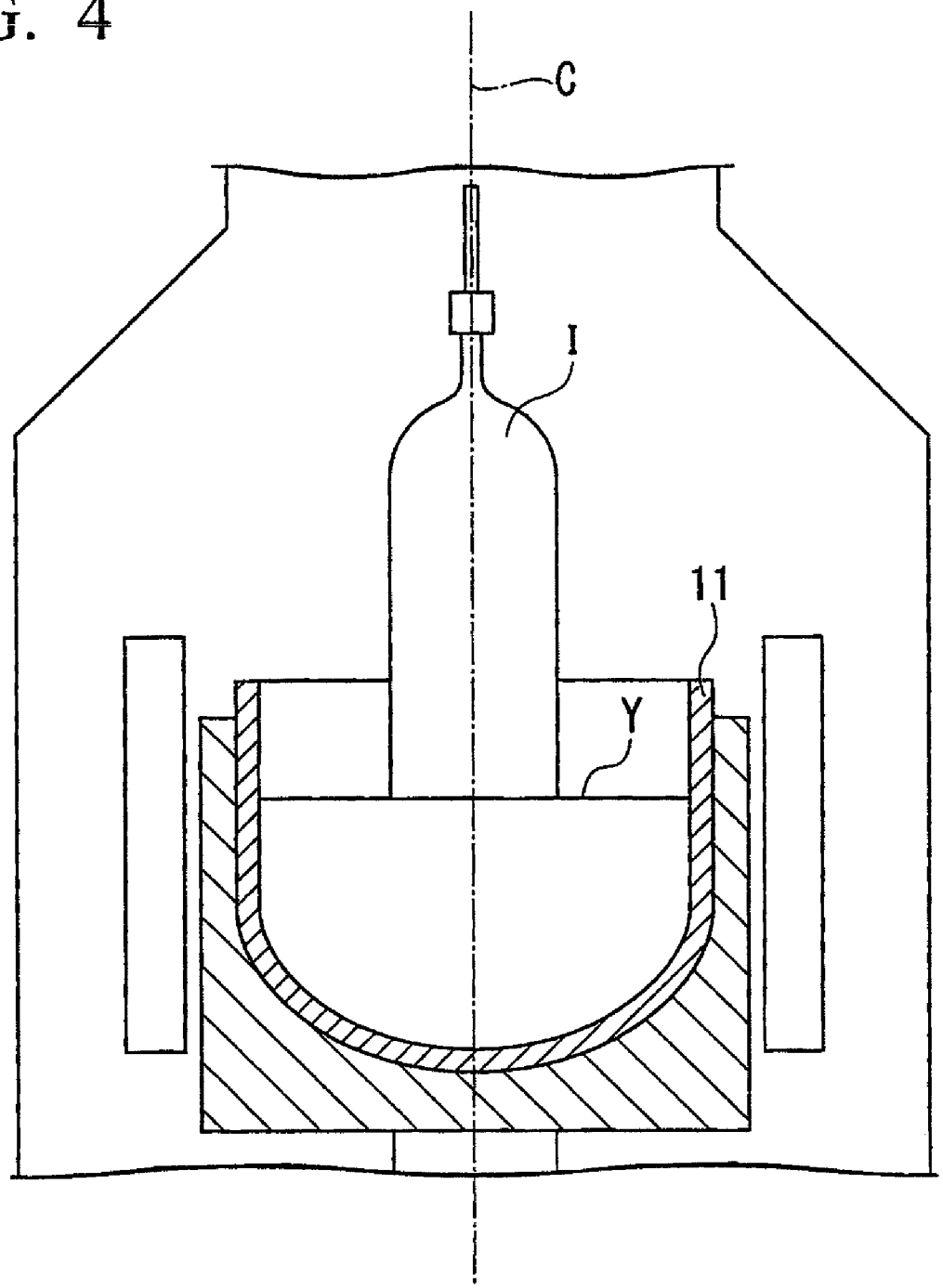
FIG. 4 is a vertical cross-sectional view showing the state of pulling up a silicon single crystal ingot from a molten silicon liquid in the silica glass crucible of an exemplary embodiment.

In FIG. 4, an exemplary embodiment of the method for producing a silicon single crystal is illustrated.

In order to perform the pulling up of a silicon single crystal using the silica glass crucible 11 of this exemplary embodiment, polycrystalline silicon is melted inside the silica glass crucible 11, and then seeds formed from silicon single crystals (not depicted) are immersed in a molten silicon liquid Y. When the seeds are pulled up while rotating the silica glass crucible 11 about the crucible axis C, a silicon single crystal ingot I is formed.

At this time, the temperature at the time of melting the silicon raw material is preferably 1420 to 1600° C.

A silicon single crystal is grown by immersing a Si seed crystal into a molten Si liquid, and pulling up the seed crystal upward while rotating it.

Since silica glass melts in the molten Si liquid during the pulling up, the properties of the silica crucible exert great influence on the properties of the silicon single crystal and the yield.

At this time, the argon partial pressure inside the furnace during the pulling up of silicon is preferably 0.40 to 66.7 kPa.

Further, the temperature during the pulling up of the silicon single crystal is preferably 1420 to 1550° C.

crucible inner surface. The open bubble density (counts/mm$^2$) is the density of pits formed from open bubbles in the crucible inner surface. The fusion dissolution rate (μm/h) is the rate at which the thickness of the crucible inner surface is reduced. The percentage of pinhole content is the number of pinholes contained in one sheet of wafer. Examples 1 to 3 provide silica glass crucibles according to the invention, while Comparative Examples 1 to 6 provides silica glass crucibles deviating from the scope of the invention.

The rate of inner side crystallization was calculated by visually observing the crucible inner surface before and after the use, and measuring the crystallized area.

The density of open bubbles was measured by observing the crucible inner side under a polarization microscope.

The dissolution rate was calculated from the difference in the crucible weight before and after use, the difference in thickness of the transparent layer, or the like.

The pinhole content was calculated by visually observing all of the sliced silicon wafers.

As shown in Table 1, in the case of using the silica glass crucible of the invention, there are present markedly fewer pinholes in the silicon single crystal, and the production yield of a silicon single crystal is high. On the other hand, the Comparative Examples all result in many pinholes in the silicon single crystals, and low production yields of silicon single crystal.

TABLE 1

|  | Rate of inner surface crystallization (%) | Density of open bubbles (counts/mm$^2$) | Dissolution rate (μm/h) | Pinhole content (%) | Retention of single crystal (%) |
| --- | --- | --- | --- | --- | --- |
| Example 1 | 4 | 0.05 | 4 | 0.001 | 88 |
| Example 2 | 10 | 02 | 20 | 0.002 | 90 |
| Example 3 | 5 | 0.01 | 10 | 0.001 | 92 |
| Comparative Example 1 | 28 | 0.07 | 17 | 0.16 | 90 |
| Comparative Example 2 | 7 | 0.005 | 18 | 0.15 | 86 |
| Comparative Example 3 | 6 | 0.5 | 17 | 0.17 | 50 |
| Comparative Example 4 | 6 | 0.05 | 27 | 0.25 | 79 |
| Comparative Example 5 | 90 | 0.005 | 30 | 0.62 | 76 |
| Comparative Example 6 | 90 | 1.1 | 18 | 0.22 | 47 |

EXAMPLES

Hereinafter, the present invention will be described with reference to Examples and Comparative Examples.

Examples 1 to 3, Comparative Examples 1 to 6

A silicon single crystal was pulled up using the silica glass crucible (mouth diameter of 28 inches) having the properties shown in Table 1, at a furnace internal pressure of 40 torr, in an atmosphere of argon gas, for a pulling time of 100 hr. The results are shown in Table 1.

Additionally, in the Table 1, the percentage of inner side crystallization is the proportion occupied by crystalline silicon formed by crystallization of amorphous silicon, in the While preferred embodiments of the invention have been described and illustrated above, it should be understood that these are exemplary embodiments, of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for pulling up a silicon single crystal from a silica glass crucible, the method comprising performing the pulling up of a silicon single crystal while restricting the dissolution rate of the crucible inner surface to 20 μm/hr or less, wherein the silica glass crucible has properties such that:
the area of crystalline silica formed by crystallization of amorphous silica to 10% or less of the inner surface area of the crucible; and
the density of pits originating from open bubbles on the crucible inner surface, to 0.01 to 0.2 counts/mm².

2. The method for pulling up a silicon single crystal according to claim 1, wherein the argon partial pressure inside the furnace during the pulling up of silicon is 0.40 to 66.7 kPa.

3. The method for pulling up a silicon single crystal according to claim 1, wherein the temperature during the pulling up of the silicon single crystal is 1420 to 1550° C.

4. The method for pulling up a silicon single crystal according to claim 1, wherein the temperature at the time of melting the silicon raw material is 1420 to 1600° C.

5. The method for pulling up a silicon single crystal according to claim 1, wherein the size of the pit is 0.2 to 2.0 mm.

6. The method for pulling up a silicon single crystal according to claim 1, wherein the pits are present on one side of the crucible surface.

* * * * *